(12) United States Patent
Cao et al.

(10) Patent No.: US 11,349,334 B2
(45) Date of Patent: May 31, 2022

(54) CHARGE BALANCING CONTROL FOR PARALLEL-CONNECTED BATTERY ENERGY STORAGE SYSTEM

(71) Applicant: Baidu USA LLC, Sunnyvale, CA (US)

(72) Inventors: Yuan Cao, Sunnyvale, CA (US);
Huawei Yang, Sunnyvale, CA (US);
Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 485 days.

(21) Appl. No.: 16/525,478

(22) Filed: Jul. 29, 2019

(65) Prior Publication Data

US 2021/0036544 A1  Feb. 4, 2021

(51) Int. Cl.
| | | |
|---|---|---|
| H02J 9/06 | (2006.01) | |
| G06F 1/26 | (2006.01) | |
| H02J 7/00 | (2006.01) | |
| H02M 3/04 | (2006.01) | |
| H02M 7/44 | (2006.01) | |
| H05K 7/14 | (2006.01) | |
| H05K 7/20 | (2006.01) | |

(52) U.S. Cl.
CPC .............. *H02J 9/061* (2013.01); *G06F 1/263* (2013.01); *H02J 7/0024* (2013.01); *H02M 3/04* (2013.01); *H02M 7/44* (2013.01); *H05K 7/1489* (2013.01); *H05K 7/1492* (2013.01); *H05K 7/20754* (2013.01); *H05K 7/20763* (2013.01)

(58) Field of Classification Search
CPC ........ H02J 9/061; H02J 7/0024; H02J 7/0048; H02J 7/0016; H02J 9/06; H02J 7/00712; G06F 1/263; G06F 1/20; G06F 1/28; G06F 1/30; G06F 1/3212; H02M 3/04; H02M 7/44; H02M 1/0009; H02M 1/0025; H02M 3/155; H05K 7/1489; H05K 7/1492; H05K 7/20754; H05K 7/20763; Y02D 10/00
See application file for complete search history.

(56) References Cited

U.S. PATENT DOCUMENTS

| | | | | |
|---|---|---|---|---|
| 4,694,194 A | * | 9/1987 | Hansel .............. | H02M 7/53803 307/66 |
| 5,631,814 A | * | 5/1997 | Zak ........................ | H02J 9/062 363/37 |
| 9,218,033 B1 | * | 12/2015 | Roy ........................ | G06F 1/263 |
| 11,183,854 B1 | * | 11/2021 | Dong ...................... | H02J 9/061 |

(Continued)

*Primary Examiner* — Stacy Whitmore
(74) *Attorney, Agent, or Firm* — Womble Bond Dickinson (US) LLP

(57) ABSTRACT

According to one embodiment, a battery backup system includes an output terminal, one or more BBUs coupled in parallel to provide backup power to an external electronic device coupled to the output terminal, and a control circuit to control the power distribution from the BBUs. Each of the BBUs includes a battery pack having one or more battery cells and a converter to regulate and output power to the output terminal. The control circuit is configured to control a duty cycle for each of the BBUs, which when used to drive the BBU, adjusts power output in order to balance charges amongst the BBUs. The duty cycle of each BBU is determined based on an output voltage across the output terminal, an output current flowing through the output terminal, and characteristics of the battery pack of the BBU.

20 Claims, 6 Drawing Sheets

(56) References Cited

U.S. PATENT DOCUMENTS

| | | | |
|---|---|---|---|
| 2009/0195211 A1* | 8/2009 | Wang | G01R 31/392 |
| | | | 320/136 |
| 2013/0031382 A1* | 1/2013 | Jau | H02J 9/00 |
| | | | 713/300 |
| 2013/0154365 A1* | 6/2013 | Sarti | H02J 9/061 |
| | | | 307/23 |
| 2015/0177808 A1* | 6/2015 | Sarti | G06F 1/30 |
| | | | 713/300 |
| 2017/0222463 A1* | 8/2017 | Pullen | H02J 7/007 |
| 2018/0067528 A1* | 3/2018 | Wang | H02J 7/0014 |
| 2019/0372179 A1* | 12/2019 | Singer | B60L 58/25 |
| 2021/0028710 A1* | 1/2021 | Cao | G06F 1/26 |
| 2021/0296900 A1* | 9/2021 | Wanes | H02J 3/14 |

* cited by examiner

CHARGE BALANCING CONTROL FOR PARALLEL-CONNECTED BATTERY ENERGY STORAGE SYSTEM

FIELD

Embodiments of the present disclosure relate generally to a backup battery system that has one or more backup battery units connected in parallel to provide backup power. More particularly, embodiments of the disclosure relate to a backup battery system for performing charge balancing control operations and other operations.

BACKGROUND

Battery Energy Storage Systems (BESSs) or Battery Backup Systems (BBSs) may provide battery power to a wide range of electronic devices, such as electrical vehicles (EVs), consumer electronics (e.g., portable consumer electronics, such as laptop computers, etc.), smart grid, data centers (e.g., an electronic rack of the data center), etc. In BBSs, a large number of battery cells or modules (or battery packs) are connected in parallel to provide high current and high power to a load. Specifically, a BBS may include multiple battery backup units (BBUs), each with one or more battery packs that may be connected in series (or in parallel) with at least one converter, which provide high current to a server board. Even though the battery packs of the BBUs may be rated the same, individual battery packs may have different capacities and may have different levels of state-of-charge (SOC), which may be due to various reasons.

For example, packs (and/or cells within the packs) may have different manufacturing specifications, their characteristics may vary differently with time (e.g., internal resistance may vary with respect to the age of the battery and exposure to temperature), and different cells (or packs) may have different charge/discharge cycles with respect to one another, etc. These differences may cause diversity during discharging/charging operations (e.g., different battery packs may discharge at different rates, etc.). These differences between packs (and/or cells) may degrade the overall performance of the BBS, and as a result the lifespan of different battery packs may be shortened and over-charging and over-discharging problems may occur.

Thus, as the operational conditions of each of the battery packs cannot be exactly the same, it is important to initiate a control technique to maintain a balanced condition of all battery packs, in order to guarantee high efficiency, reliability, and safety of the BBS. This technique is referred to as "charge balancing". There has been a lack of efficient ways to balance the charge of battery cells.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
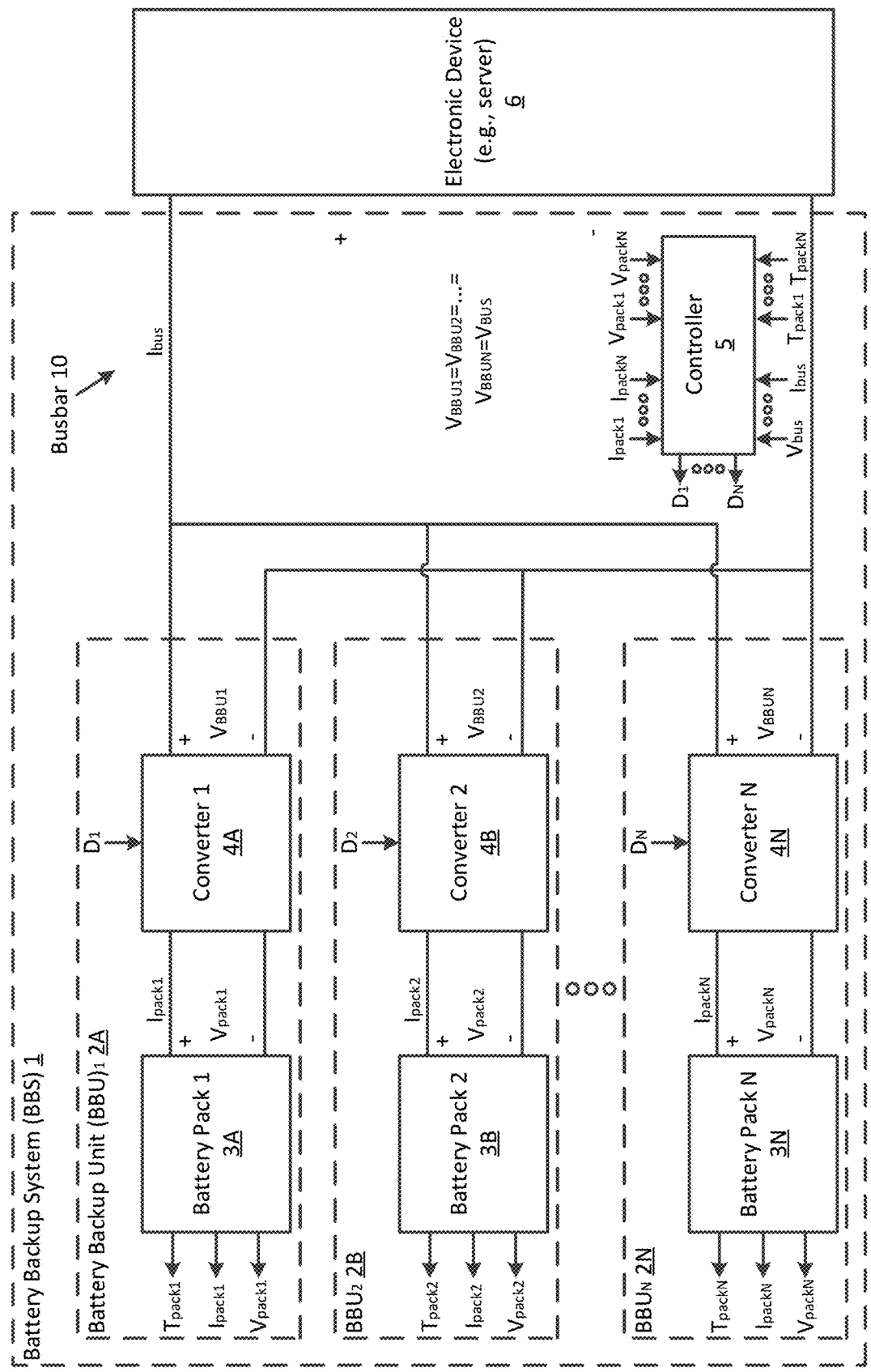
FIG. 1 is a block diagram illustrating an example of a battery backup system (BBS) according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of the each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, an embodiment of the present disclosure describes a BBS that is capable of performing a charge-balancing control process that balances charge between parallel-connected BBUs by individually adjusting the BBUs' power output. Specifically, the BBS produces, for each of the BBUs an individualized duty cycle, which when used to drive the (e.g., converter of the) BBU, adjusts the power output in order to implement charge balancing between the BBUs. To produce the duty cycle, the BBS measures (or senses) a bus voltage across a busbar (or a load) in which the parallel-connected BBUs are coupled and measures a bus current that is flowing through the busbar. The BBS may measure battery characteristics of each of the BBUs battery pack in order to determine the capacity of the pack. For instance, the capacity may be determined by estimating a state-of-charge (SOC) of the pack based on an input voltage of the BBUs converter. Based on these criteria, the BBS may personalize duty cycles of each of the BBUs in order to individually manage the power output based on power capabilities of the BBU. As a result, the BBS may increase the life-span of the BBUs and increase overall system efficiency. In some embodiments, in lieu of (or in addition to) performing charge-balancing control, the BBS is capable of performing both voltage current regulation operations. The BBS includes a voltage control circuit and a current control circuit for the purposes of regulating converter voltage and current (and charge balancing) at the same time.

According to one aspect, a battery backup system includes an output terminal, one or more BBUs coupled in parallel to provide backup power to an external electronic device coupled to the output terminal, and a control circuit to control the power distribution from the BBUs. Each of the BBUs includes a battery pack having one or more battery cells and a converter to regulate and output power to the output terminal. The control circuit is configured to control a duty cycle for each of the BBUs, which when used to drive the BBU, adjusts power output in order to balance charges amongst the BBUs. The duty cycle of each BBU is determined based on an output voltage across the output terminal, an output current flowing through the output terminal, and characteristics of the battery pack of the BBU.

In one embodiment, the control circuit includes a voltage control circuit to measure the output voltage across the output terminal and to produce a reference duty cycle for the converter of each BBU based on a difference between the output voltage and a reference output voltage. The control circuit further includes a charge balancing circuit for each BBU that is configured to estimate an available capacity of the BBU based on at least one characteristic of the battery pack of the BBU. The characteristics include at least one of a state-of-charge (SOC) or a state-of-health (SOH) of the battery pack.

In one embodiment, the charge balancing circuit includes a charge balancing mixer to determine a difference between the available capacity of the BBU and an average capacity of at least some of the BBUs and to adjust an average current according to the difference to produce a reference current for the BBU. In one embodiment, the control circuit further includes a current control circuit having a current control mixer to determine a difference between the reference current for the BBU and a current being supplied to the converter from the power pack of the BBU. In one embodiment, the converter may be a direct-current (DC) to DC (DC/DC) converter or a DC to alternating current (DC/AC) converter.

In one embodiment, the BBS may be implemented as a power shelf that can be inserted into a slot of an electronic rack of a data center, where the electronic rack includes a number of slots and at least some of the slots host a server blade having one or more servers therein. The output terminal may be coupled to a power rail of a backplane of the electronic rack when the BBS is inserted. The server blades draw power from the power rail from the backplane. The BBS is configured to provide backup power to the server blades when the main power supply becomes unavailable.

According to another aspect, an electronic rack includes a stack of server blades, a power supply, and a BBS coupled to the power supply and the server blades. The BBS includes at least some of the components as described above.

FIG. 1 shows a block diagram illustrating an example of a BBS according to one embodiment. Specifically, this figure shows a BBS 1 that is coupled (e.g., via a busbar 10) to an electronic device (or an external load) 6 in order to provide battery (backup) power to the device. A busbar refers to a power rail or power bus, which is typically disposed on a backplane of an electronic rack. As described herein, the electronic device may be any device that is configured to draw battery energy (e.g., a data center, an EV, etc.). In one embodiment, the BBS 1 may be coupled to two or more devices.

The BBS 1 includes one or more BBUs 2A-2N and a controller (or control circuit) 5. Each BBU 2 includes a battery pack 3 that is coupled to a converter 4 to provide battery energy to the converter in the form of $I_{pack}$ and $V_{pack}$. A battery pack may include one or more battery cells contained therein. For instance, $BBU_1$ 2A includes battery pack 1 3A that is coupled to converter 1 4A. In some embodiments, the battery pack may include one battery cell, or may include two or more battery cells that are series connected, parallel connected, or a combination. The battery cells may be of any type, such as Lithium-ion, Nickel Cadmium, etc. In one embodiment, a battery pack may have a mixture of types of battery cells. In another embodiment, the battery pack (and/or battery cells) of different BBUs may be different with respect to one another. For instance, one BBU may have a battery pack of one type (e.g., a battery pack with battery cells of a certain size, type, etc.), while another BBU may have a battery back of a different type (e.g., a battery pack with battery cells of a different size, type, etc., with respect to the other type).

In some embodiments, the converter 4 may be any type of switch-mode converter, such as a direct-current to direct-current (DC/DC) converter that may be configured to regulate and output power into the busbar in either a continuous conduction mode or a discontinuous conduction mode. The DC/DC converter 4 may be a buck converter, a boost converter, or a buck-boost converter. In another embodiment, the converter 4 may be a direct-current to alternating-current (DC/AC) converter (or inverter) that is configured to converter battery energy (DC power) into AC power to be injected into the busbar 10. In one aspect, the converter 4 (either DC/DC or DC/AC) may be a bidirectional converter that allows power to flow from the battery pack 3 into the busbar 10, and vice a versa (e.g., in order to discharge and charge the battery pack).

In one embodiment, at least some of the BBUs may be removable from the BBS. Specifically, each of the BBUs may be parallel connected via a connector (or two or more terminals) that connects to one another and/or to the busbar 10. Thus, a BBU may be disconnected from the BBS (by disconnecting a connector) in order to remove the BBU and/or replace the BBU with a new one. More about BBUs being removed is described herein.

The controller 5 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory.

In one embodiment, the controller 5 is configured to perform a combination of voltage regulation, current regulation, and/or charge balancing as described herein. Specifically, the controller measures the output voltage of each of the battery packs, $V_{pack}$ (or the input voltage of each converter 4), measures the output current of each of the battery packs, $I_{pack}$, and measures a characteristic of each of the battery packs.

In this case, the characteristic is the temperature of each of the battery packs, $T_{pack}$. In addition, the controller measures the bus voltage $V_{bus}$ across the busbar 10 and the bus current $I_{bus}$ flowing through the busbar 10, which may represent the output voltage and output current of BBS 1. From a combination of these measurements, the controller produces individual duty cycle control signals D to drive each of the converters 4 to output power into the busbar based on the BBU's battery pack capacity. A duty cycle control signal represents a pulse signal to drive a switching device (e.g., a gate terminal of a metal-oxide-semiconductor field-effect transistor or MOSFET) of the converter. Specifically, when used to drive a BBU in real-time, the duty cycle D may adjust power output in order to implement charge balancing between BBUs. Since each of the BBUs 2 is in parallel with one another, the output voltage of each of the BBUs may be regulated to equal $V_{bus}$. Since the battery cells may be aged differently and their stored energy levels may be different, by controlling the duty cycle of the corresponding converter, the charging or discharging of the battery cells may be balanced. More about how the controller performs these operations is described herein.

Figure 2:
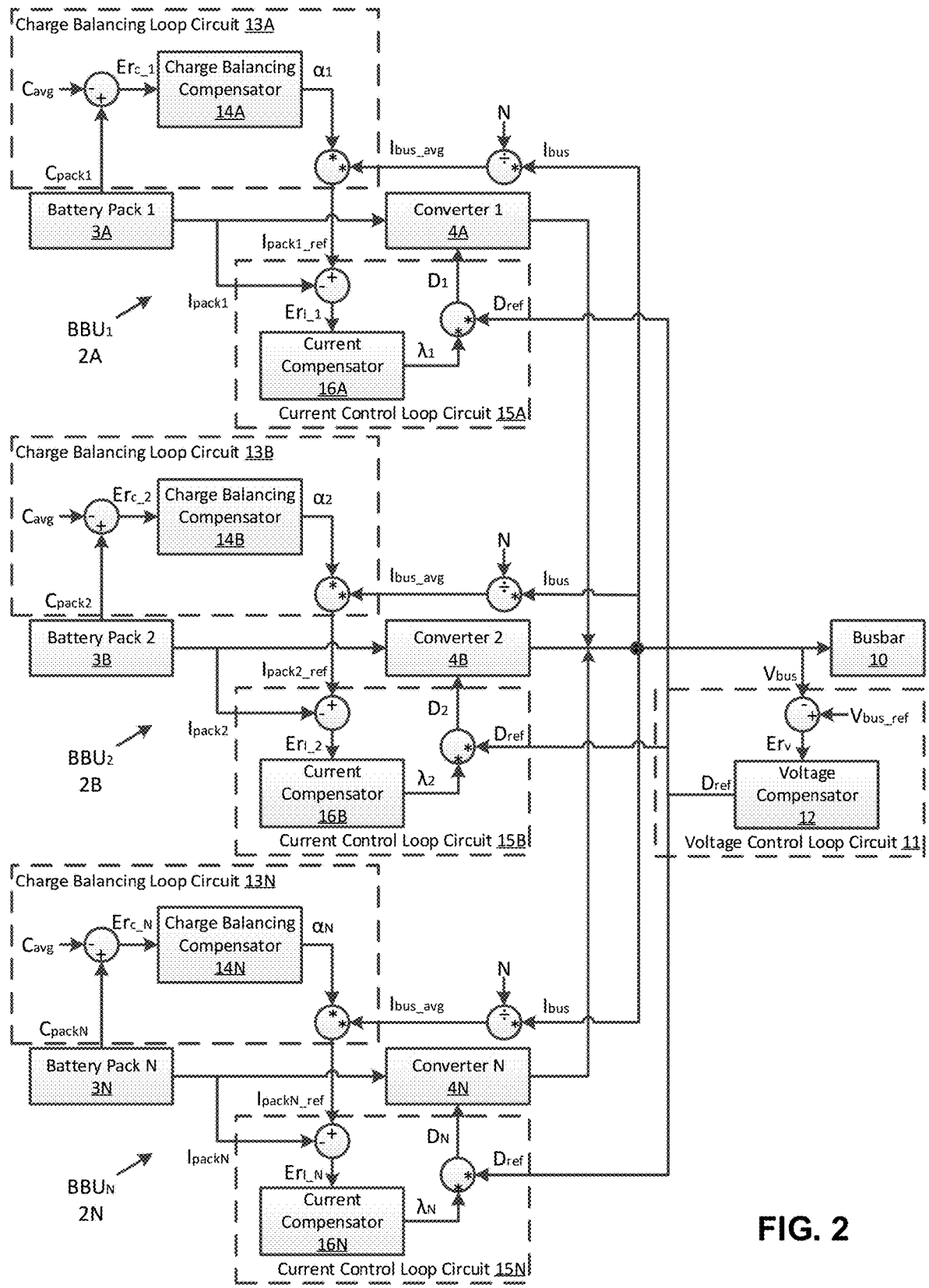
FIG. 2 is a schematic diagram illustrating an example of a BBS according to another embodiment.

FIG. 2 shows a block diagram illustrating an example of a BBS according to another embodiment. Specifically, this figure shows operations performed by the (e.g., controller 5 of the) BBS 1 to control charge balancing between BBUs 2A-2N and other operations in order for the BBUs to provide power to the busbar 10 (which may be coupled to the electronic device 6). In this figure, there is a voltage control loop circuit 11 that is configured to regulate $V_{bus}$ and for each of the BBUs 2 there is a current control loop circuit 15 that is configured to regulate a corresponding converter's input current $I_{pack}$ that is drawn from a corresponding battery pack, and a charge balancing loop circuit 13 that is configured to adjust the reference value $I_{pack\_ref}$ based on the battery pack's capacity. In one embodiment, each of the loop circuits 11, 13, and 15 may be a part of the controller (or control circuit) 5.

In another embodiment, at least some of the BBUs may include at least one of the loop circuits integrated therein (e.g., within a housing of the BBU). For example, BBU1 2A may include battery pack 1 3A, converter 1 4A, charge balancing loop circuit 13A, and current control loop circuit 15A integrated therein. Note, for simplicity this figure will be described with reference to the first BBU$_1$ 2A and the associated loop circuits 13A and 15A. It should be understood, however, that each of the operations described herein with respect to loop circuits 13A and 15A may be performed by any of the other loop circuits associated with other BBUs (e.g., loop circuits 13B-13N and 15B-15N, respectively).

Figure 3:
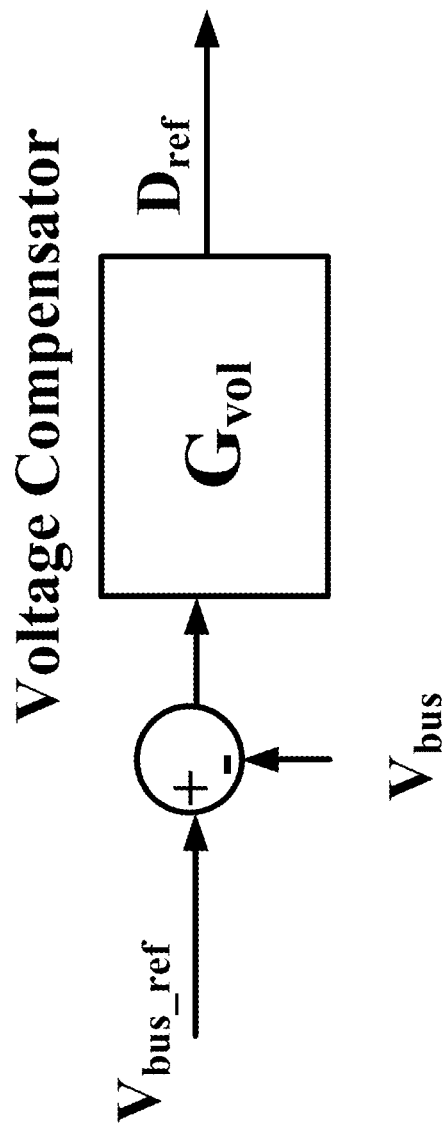
FIG. 3 is a schematic diagram illustrating an example of a voltage control circuit according to one embodiment.

A process by which the (e.g., controller 5 of the) BBS 1 performs voltage/current regulation and/or charge balance operations will now be described. The voltage control loop circuit 11 is configured to measure (or sense) $V_{bus}$ across the busbar 10 and compare $V_{bus}$ with a reference voltage $V_{bus\_ref}$, as shown in FIG. 3, to produce an error $Er_v$. A voltage compensator 12 is configured to obtain $Er_v$ produced by the comparison and output a reference duty cycle $D_{ref}$ to each of the converters 4 (or current control loop circuits 15, as shown) according to $Er_v$. Alone, each BBU may use $D_{ref}$ to drive a corresponding converter (e.g., controlling a duty cycle of the converter) to output a specific voltage for the purpose of regulating an output voltage of the corresponding converter according to $V_{bus\_ref}$. As described herein, however, the duty cycle of each converter may be adjusted individually or independently based on the capacity of a battery pack from which the converter draws power from. In some embodiment, to produce the reference duty cycle, the compensator 12 may apply a gain to $Er_v$.

The charge balancing loop circuit 13A is configured to modulate $I_{pack1\_ref}$ from BBU$_1$'s corresponding battery pack 3A according to its available capacity, $C_{pack1}$. Specifically, the circuit 13A is configured to estimate $C_{pack1}$ based on at least one characteristic of the battery pack. For example, the loop circuit 13A may estimate $C_{pack1}$ using the state-of-charge (SOC) of the battery, the state-of-health (SOH) of the battery the re of the battery, etc. For example, the loop circuit 13A may estimate $C_{pack1}$ by performing a table lookup that associates one or more battery characteristics with capacity. In another embodiment, the charge balancing loop circuit may directly correlate the available capacity with one or more of the battery characteristics. For instance, the circuit may estimate $C_{pack1}$ to be a current SOH estimate of the battery pack, a current SOC estimate of the battery pack, or a product of the SOH estimate and the SOC estimate. In one embodiment, the loop circuit may use any method to estimate the battery characteristics. For instance, the loop circuit may determine the SOC by using $V_{pack1}$.

The charge balancing loop circuit is configured to obtain the average capacity $C_{avg}$ of the total capacity of all the BBUs, which is based on the following equation.

$$C_{avg} = \frac{(C_{pack1} * \beta_1 + C_{pack2} * \beta_2 + \ldots * C_{packN} * \beta_N)}{(\beta_1 + \beta_2 + \ldots + \beta_N)}$$

In this equation, the average capacity is determined by multiplying each BBU's capacity estimate with $\beta$, which is an enable/disable indicator of the corresponding BBU. For instance, if the BBU is removed from the BBS or it does not function normally, the corresponding indicator $\beta$ is set to 0. Otherwise, if the BBU is operating normally, the corresponding indicator $\beta$ is set to 1. In one embodiment, the BBS may determine that a BBU is not functioning normally based on the determined battery characteristics. For instance, the BBS may set an indicator to 0 when a SOC of a BBU is below a threshold (e.g., 10%). In another embodiment, the BBS may set an indicator to 0 based on past performance of the BBU (e.g., based on whether a temperature of the BBU is consistently above a threshold temperature). In one embodiment, when a BBU is determined not to be functioning normally, charge balancing and/or current regulation operations as described herein may not be performed for the BBU.

Figure 4:
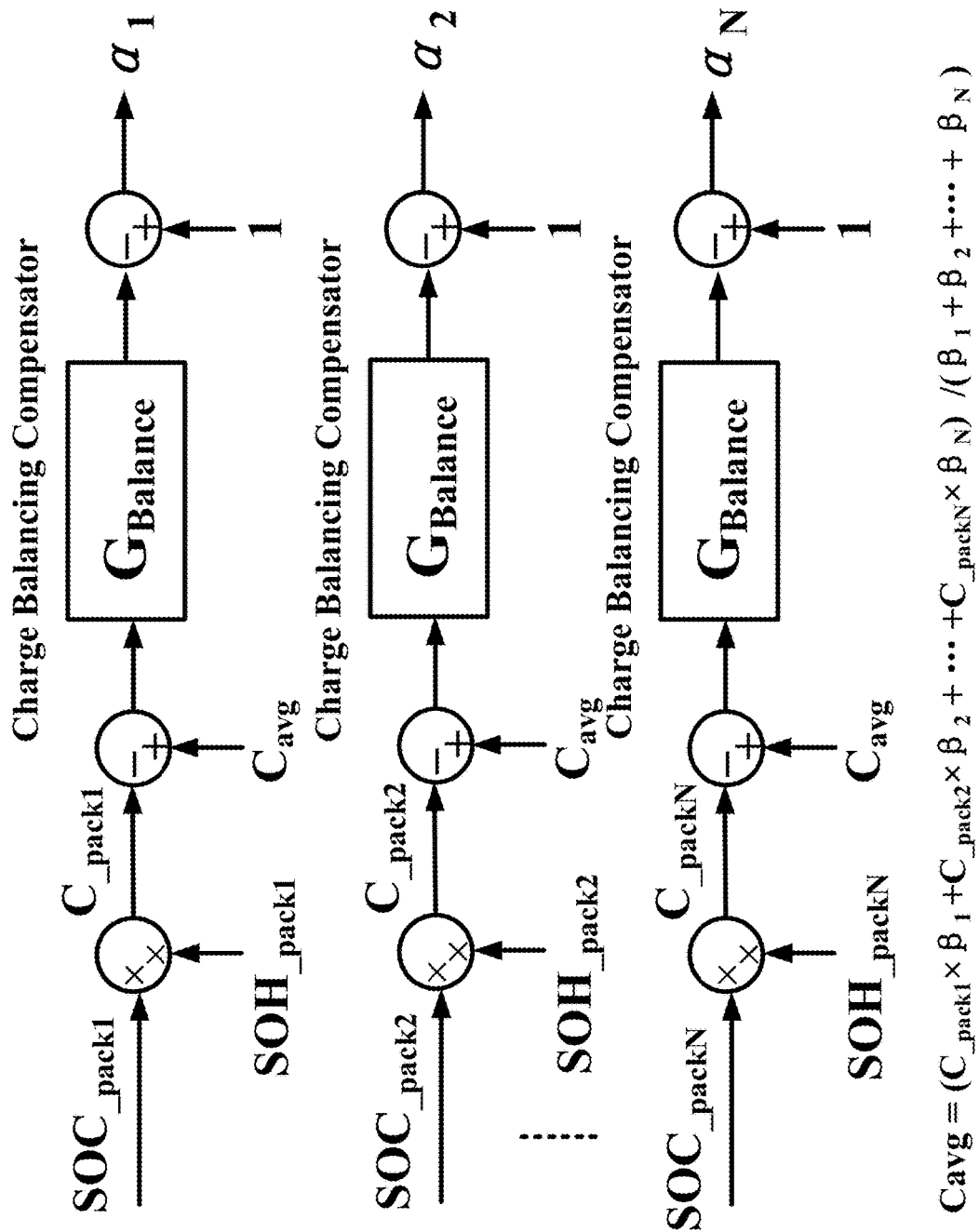
FIG. 4 is a schematic diagram illustrating an example of a charge balancing control circuit according to one embodiment.

The loop circuit 13A determines an error $Er_{c\_1}$ based on a difference between $C_{pack1}$ and $C_{avg}$. A charge balancing compensator 14A obtains $Er_{c\_1}$ and produces a charge balancing multiplier $\alpha_1$. As a result, a BBU with a higher $C_{pack}$ will generate a larger $\alpha$, while a BBU with a lower $C_{pack}$ will generate a smaller $\alpha$. In one embodiment, $\alpha$ may be a value between zero and two, as shown in FIG. 4. In another embodiment, the compensator 14A may apply a gain to $Er_{c\_1}$, which is then subtracted by one in order to produce $\alpha_1$. The loop circuit 13A obtains an average bus current $I_{bus\_avg}$, which may be equal to the bus current $I_{bus}$ divided by the number of BBUs. In some embodiments, $I_{bus\_avg}$ may be equal to $I_{bus}$ divided by the number of BBUs that are operating normally (e.g., with $\beta$'s that equal 1). The charge balancing loop circuit adjusts $I_{bus\_avg}$ according to $\alpha_1$ (e.g., multiplies $\alpha_1$ with $I_{bus\_avg}$) to produce a reference current value $I_{pack1\_ref}$.

Figure 5:
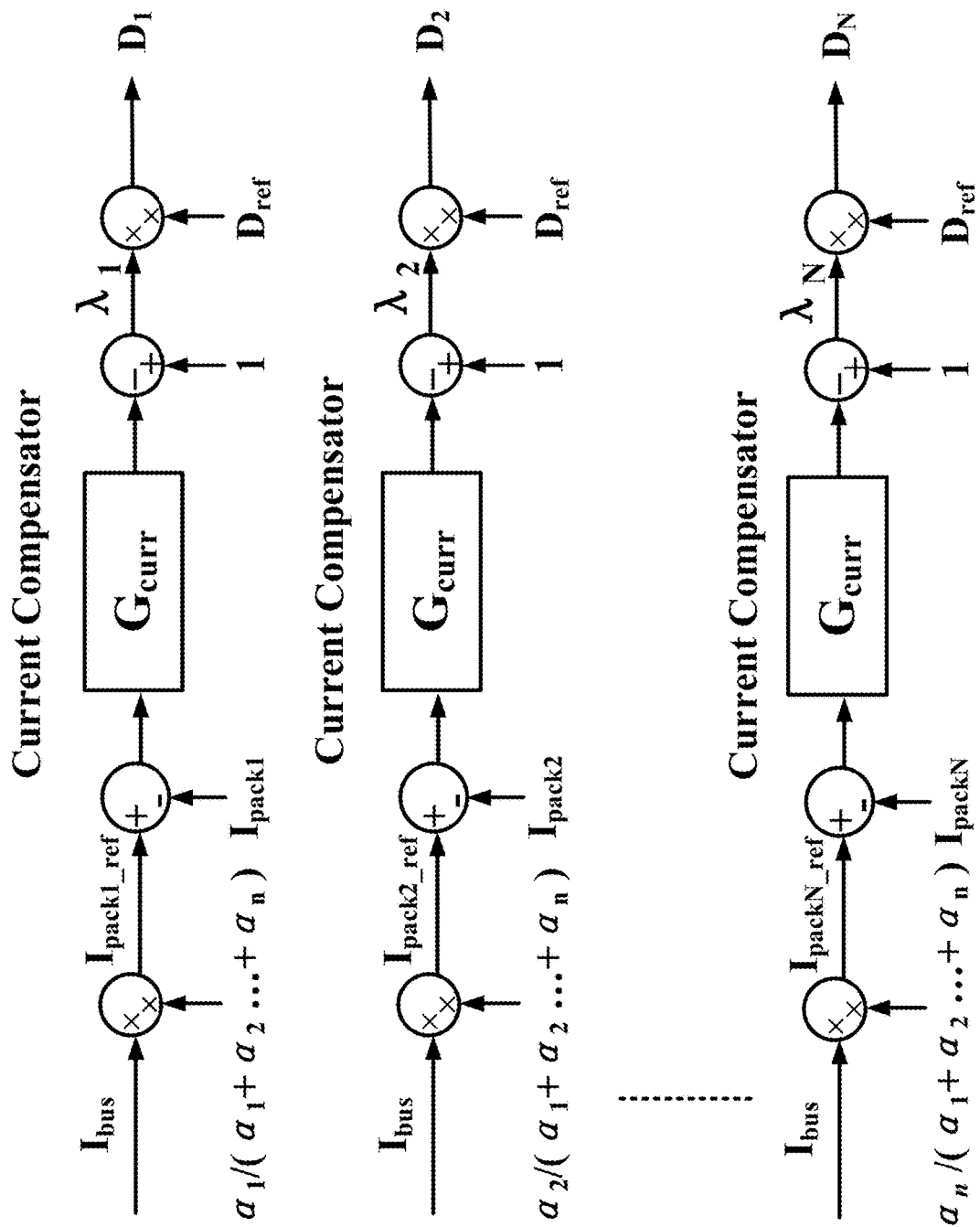
FIG. 5 is a schematic diagram illustrating an example of a current control circuit according to one embodiment.

The current control loop circuit 15A is configured to regulate the input current $I_{pack1}$ of converter 1 4A. Specifically, the loop circuit 15A obtains $I_{pack1\_ref}$ and determines an error $Er_{I\_1}$ based on a difference between $I_{pack1}$ and $I_{pack1\_ref}$. A current compensator 16A obtains $Er_{I\_1}$ and uses the error to produce a current control multiplier $\lambda_1$, as shown in FIG. 5. In one embodiment, the current compensator 16A may apply a gain to $Er_{I\_1}$, which is then subtracted by one in order to produce $\lambda_1$. The current control loop circuit adjusts the reference duty cycle $D_{ref}$ according to the current control multiplier $\lambda_1$ to produce an individualized duty cycle $D_1$ for BBU$_1$. Specifically, the current control loop circuit multiples $D_{ref}$ by $\lambda_1$ to produce $D_1$ that is used for driving the converter 1 4A to output power into the busbar 10.

In one embodiment, the duty cycle $D_N$ for the Nth BBU can be calculated as given by the following equation.

$$D_N = D_{ref} \times \lambda_N =$$

$$D_{ref} \times \left(1 - G_{cuur} \times \left(I_{bus} \times \frac{\alpha_N}{\alpha_1 + \alpha_2 \ldots + \alpha_n}\right) - I_{packN}\right) = (V_{bus_{ref}} - V_{bus}) \times$$

$$G_{vol} \times \left(1 - G_{cuur} \times \left(I_{bus} \times \frac{\alpha_N}{\alpha_1 + \alpha_2 \ldots + \alpha_n}\right) - I_{packN}\right) =$$

$$(V_{bus\_ref} - V_{bus}) \times G_{vol} \times$$

$$\left(1 - G_{cur} \times \left(I_{bus} \times \frac{(1 - ((B_{Char}) \times G_{bal} - C_{avg}))}{N}\right) - I_{packN}\right)$$

In this equation, $G_{vol}$ is the gain applied by the voltage compensator 12, $G_{cur}$ is the gain applied by the current compensator 16A, and $G_{bal}$ is the gain applied by the charge balancing compensator 14A, and $B_{char}$ are one or more battery characteristics as described herein. For instance, $B_{char}$ may be $SOC_{packN}$, $SOH_{packN}$, or a product of both values.

In one embodiment, the BBS 1 is capable of regulating the bus voltage, regulating the input current of each converter, and charge balancing each (or at least some) of the BBUs in real-time. If it is determined that $BBU_1$ 2A has a higher available capacity than $BBU_2$ 2B (based on $\alpha_1$ being higher than $\alpha_2$), the BBS may drive converter 1 4A to output more power than converter 2 4B (based on $D_1$ being higher than $D_2$). For example, since both converters will be driven at different duty cycles, each converter may have a slightly different output voltage. The converter with the higher voltage will output more power than the converter with the lower voltage. Converters may have different output voltages even when in parallel because of slightly different internal resistances, where $V_{bus}$ is the combination of each of the output voltages of the converters (e.g., based on Thevenin's Theorem). In one embodiment, an electrical component may be placed in series with at least some of the converters (e.g., a resistor, a diode, a capacitor, etc.) in order to promote load sharing.

In one embodiment, at least some of the converters 4 are unidirectional switching devices that only allows an electronic current to flow from a corresponding battery pack to the (e.g., DC/DC) converter 4. In another embodiment, at least some of the converters are bidirectional switching devices. In this case, when the electronic device 6 is an external load that is an external power supply it may be configured to provide power through the busbar 10 to charge one or more battery packs of the BBUs.

As described above, a BBS can be utilized as a backup power supply unit in an electronic rack of a data center. An electronic rack includes an array of server blades, each including a computer server for data processing. The electronic rack further includes a power supply to provide power to the server blades and a BBS to provide backup power to the server blades when the power supply is unavailable. The BBS includes components (e.g., a controller circuit) that can perform charge balancing control operations to maintain balance of all BBUs of the BBS as described above. By embedding a controller circuit as a part of the BBS (and/or at least some of the BBUs of the BBS), charge may be balanced between BBUs in order to guarantee high efficiency, reliability, and safety of the BBS.

Figure 6:
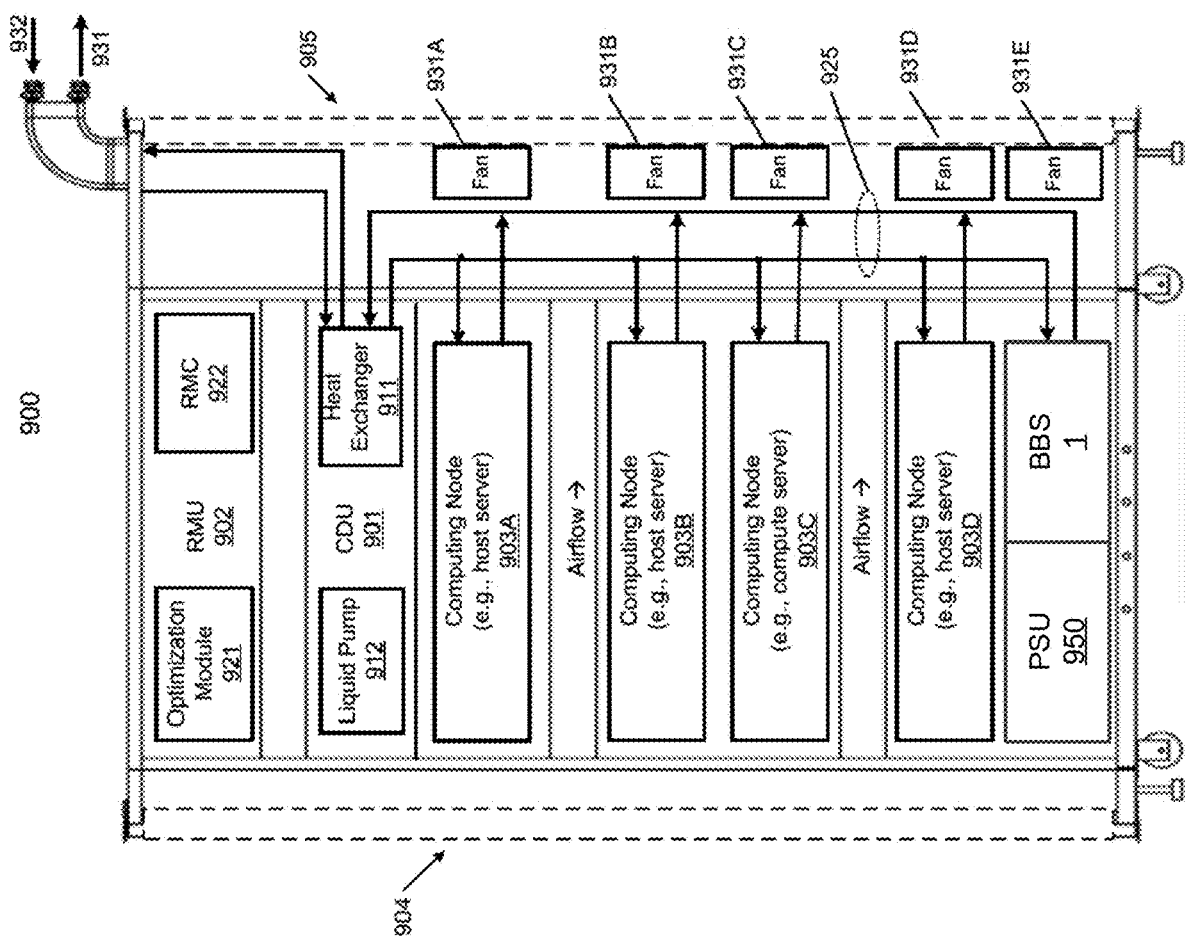
FIG. 6 shows an example of an electronic rack containing a backup battery pack according to one embodiment.

FIG. 6 is a block diagram illustrating an example of an electronic rack according to one embodiment. Electronic rack 900 may include one or more server slots to contain one or more servers respectively. Each server includes one or more information technology (IT) components (e.g., processors, memory, storage devices, network interfaces). Referring to FIG. 3, according to one embodiment, electronic rack 900 includes, but is not limited to, CDU 901, rack management unit (RMU) 902 (optional), a power supply unit (PSU) 950, the BBS 1 (which may include one or more BBUs and/or control circuitry, as described herein), and one or more server blades 903A-903D (collectively referred to as server blades 903). Server blades 903 can be inserted into an array of server slots respectively from frontend 904 or backend 905 of electronic rack 900. The PSU 950 and/or BBS 1 may be inserted into any of server slots 903 within the electronic rack 900. In one embodiment, at least one of the BBUs associated with the BBS 1 may be inserted into any of server slots 903 within the electronic rack 900.

Note that although there are only four server blades 903A-903D shown here, more or fewer server blades may be maintained within electronic rack 900. Also note that the particular positions of CDU 901, RMU 902, PSU 950, BBU 910, and server blades 903 are shown for the purpose of illustration only; other arrangements or configurations of CDU 901, RMU 902, BBU 910, and server blades 903 may also be implemented. Note that electronic rack 900 can be either open to the environment or partially contained by a rack container, as long as the cooling fans can generate airflows from the frontend to the backend.

In addition, a fan module can be associated with each of the server blades 903, and the BBS 1. In this embodiment, fan modules 931A-931E, collectively referred to as fan modules 931, and are associated with server blades 903A-903D and BBS 1 respectively. Each of the fan modules 931 includes one or more cooling fans. Fan modules 931 may be mounted on the backends of server blades 903 and BBS 1 to generate airflows flowing from frontend 904, traveling through the air space of the sever blades 903, and existing at backend 905 of electronic rack 900. In one embodiment, each of the fan modules may be mounted on the backends of the server blades 903 and one or more BBUs of the BBS 1.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein. As an example, cooling device 108 shown in FIG. 7 may connect to 925 to complete a full fluid loop.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. Optimization module 921 and RMC 922 can communicate with a controller in some of the applications. RMU 902 may be coupled to PSU 950 to manage the power consumption of the PUS. The PSU 950 may include the necessary circuitry (e.g., an alternating current (AC) to direct current (DC) or DC to DC power converter, backup battery, transformer, or regulator, etc.,) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance are adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 (e.g., 903A, 903B, 903C, and/or 903D) may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an aspect of the disclosure may be a non-transitory machine-readable medium (such as microelectronic memory) having stored thereon instructions, which program one or more data processing components (generically referred to here as a "processor") to perform the voltage regulation operations, current regulation operations, and charge-balancing control operations. In other aspects, some of these operations might be performed by specific hardware components that contain hardwired logic. Those operations might alternatively be performed by any combination of programmed data processing components and fixed hardwired circuit components.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:
1. A battery backup system (BBS), comprising:
an output terminal to be coupled to an external electronic device;
a plurality of backup battery units (BBUs) coupled in parallel to provide backup power to the electronic device via the output terminal, wherein each of the BBUs includes a battery pack having one or more battery cells, and
a converter coupled to the battery pack to regulate and output power to the output terminal; and
a control circuit coupled to the converter of each of the BBUs, wherein the control circuit is configured to control a duty cycle for each of the BBUs, which when used to drive the BBU, adjusts power output in order to balance charges amongst the BBUs, wherein the duty cycle produced for each BBU is based on an output voltage across the output terminal, an output current flowing through the output terminal, and a characteristic of the battery pack of the BBU.

2. The BBS of claim 1, wherein the control circuit comprises a voltage control circuit configured to measure the output voltage across the output terminal and to produce a reference duty cycle for the converter of each of the BBUs based on a difference between the output voltage and a reference output voltage.

3. The BBS of claim 1, wherein the control circuit comprises a charge balancing circuit for each of the BBUs that is configured to estimate an available capacity of the BBU based on at least one characteristic of the battery pack of the BBU.

4. The BBS of claim 3, wherein the characteristic comprises at least one of a state-of-charge (SOC) of the battery pack and a state-of-health (SOH) of the battery pack.

5. The BBS of claim 3, wherein the charge balancing circuit for each of the BBUs includes a mixer configured to
determine a capacity difference between the available capacity of the BBU and an average capacity of at least some of the plurality of BBUs; and
adjust an average current based on the capacity difference to produce a reference current for the BBU.

6. The BBS of claim 5, wherein the control circuit comprises a current control circuit for each of the BBUs that is configured to
determine using a current control mixer a current difference between the reference current for the BBU and a current that is being supplied to the converter from a power pack of the BBU; and
adjust the reference duty cycle based on the current difference to produce a duty cycle value for the BBU.

7. The BBS of claim 1, wherein the converter is one of a direct-current to direct-current (DC/DC) converter that is configured to provide DC power to the output terminal or a direct-current to alternating-current (DC/AC) converter that is configured to convert DC power from the battery pack into AC power.

8. The BBS of claim 1, wherein the BBS is implemented as a power shelf capable of being inserted into a slot of an electronic rack of a data center, wherein the electronic rack includes a plurality of slots and at least some of the slots host a server blade having one or more servers.

9. The BBS of claim 8, wherein each of the server blades is coupled to a power rail disposed on a backplane of the electronic rack, and wherein when the BBS is inserted into the electronic rack, the output terminal is coupled to the power rail of the backplane.

10. The BBS of claim 8, wherein the BBS is configured to provide backup power to the server blades when a main power supply of the electronic rack is unavailable.

11. An electronic rack, comprising:
a plurality of server blades arranged in a stack, each server blade including one or more servers to provide data processing services;
a power supply coupled to the server blades to provide power to operate the servers; and
a battery backup system (BBS) coupled to the server blades and the power supply, the BBS including
an output terminal to be coupled to an external electronic device,
a plurality of backup battery units (BBUs) coupled in parallel to provide backup power to the electronic device via the output terminal, wherein each of the BBUs includes
a battery pack having one or more battery cells, and
a converter coupled to the battery pack to regulate and output power to the output terminal, and
a control circuit coupled to the converter of each of the BBUs, wherein the control circuit is configured to control a duty cycle for each of the BBUs, which when used to drive the BBU, adjusts power output in order to balance charges amongst the BBUs, wherein the duty cycle produced for each BBU is based on an output voltage across the output terminal, an output current flowing through the output terminal, and a characteristic of the battery pack of the BBU.

12. The electronic rack of claim 11, wherein the control circuit comprises a voltage control circuit configured to measure the output voltage across the output terminal and to produce a reference duty cycle for the converter of each of the BBUs based on a difference between the output voltage and a reference output voltage.

13. The electronic rack of claim 11, wherein the control circuit comprises a charge balancing circuit for each of the BBUs that is configured to estimate an available capacity of the BBU based on at least one characteristic of the battery pack of the BBU.

14. The electronic rack of claim 13, wherein the characteristic comprises at least one of a state-of-charge (SOC) of the battery pack and a state-of-health (SOH) of the battery pack.

15. The electronic rack of claim 13, wherein the charge balancing circuit for each of the BBUs includes a charge balancing mixer configured to
determine a capacity difference between the available capacity of the BBU and an average capacity of at least some of the plurality of BBUs; and
adjust an average current based on the capacity difference to produce a reference current for the BBU.

16. The electronic rack of claim 15, wherein the control circuit comprises a current control circuit for each of the BBUs that is configured to
determine using a current control mixer a current difference between the reference current for the BBU and a current that is being supplied to the converter from a power pack of the BBU; and
adjust the reference duty cycle based on the current difference to produce a duty cycle value for the BBU.

17. The electronic rack of claim 11, wherein the converter is one of a direct-current to direct-current (DC/DC) converter that is configured to provide DC power to the output terminal or a direct-current to alternating-current (DC/AC) converter that is configured to convert DC power from the battery pack into AC power.

18. The electronic rack of claim 11, wherein the BBS is implemented as a power shelf capable of being inserted into one of a plurality of slots, wherein at least one of the slots hosts one of the server blades.

19. The electronic rack of claim 18, further comprising a backplane having a power rail, wherein when the BBS is inserted into the slot, the output terminal is coupled to the power rail of the backplane.

20. The electronic rack of 19, wherein the server blades draw power from the power rail either from a power supply unit or the BBS.

\* \* \* \* \*